United States Patent [19]

Hecq et al.

[11] Patent Number: 4,880,677
[45] Date of Patent: Nov. 14, 1989

[54] MATTED GLASS

[75] Inventors: André Hecq, Nalinnes; Jean-Francois Thomas, Ottignies, both of Belgium

[73] Assignee: Glaverbel, Brussels, Belgium

[21] Appl. No.: 35,267

[22] Filed: Apr. 6, 1987

[30] Foreign Application Priority Data

Apr. 8, 1986 [GB] United Kingdom ............ 8606495

[51] Int. Cl.$^4$ ............................................. C03C 15/00
[52] U.S. Cl. .................................... 428/38; 428/141; 428/142
[58] Field of Search ............... 428/141, 38, 142, 426, 428/908, 913, 913.3

[56] References Cited

U.S. PATENT DOCUMENTS

| 937,550 | 10/1909 | Rembusch | 428/141 |
|---|---|---|---|
| 1,694,706 | 12/1928 | Heiz | 428/141 |
| 2,401,537 | 6/1946 | Adams | 428/141 X |
| 2,697,893 | 12/1954 | Schaum | 428/141 |
| 2,955,927 | 4/1960 | Ogata | |

FOREIGN PATENT DOCUMENTS

| 0106301 | 4/1984 | European Pat. Off. |
| 0102204 | 7/1984 | European Pat. Off. |
| 551460 | 2/1943 | United Kingdom |
| 747738 | 4/1956 | United Kingdom |
| 876861 | 9/1961 | United Kingdom |
| 878594 | 10/1961 | United Kingdom |
| 883663 | 12/1961 | United Kingdom |
| 1019415 | 2/1966 | United Kingdom |
| 042969 | 9/1966 | United Kingdom |
| 1091823 | 11/1967 | United Kingdom |
| 1151931 | 7/1969 | United Kingdom |
| 183447 | 3/1970 | United Kingdom |
| 1290863 | 7/1970 | United Kingdom |
| 1246193 | 9/1971 | United Kingdom |
| 2102786 | 7/1986 | United Kingdom |

OTHER PUBLICATIONS

Elmer, T. H. et al., "Antireflection Films On Alkali-Borosilicate Glasses Produced by Chemical Treatments", *Ceramic Bulletin*, vol. 58, No. 11, pp. 1092-1097 (1979).

Kotani, M., JP-A-5749278, Mar. 23, 1982, Pat. Abs. of Japan, vol. 6, No. 123 (E117) [1001] 7/8/82.

Mori, K., JP-A-5982777, May 12, 1984, Pat. Abs. of Japan, vol. 8, No. 194 (E-264) [1631] 9/6/84.

Yamazaki, S., JP-A$^3$ 59 123283, Jul. 17, 1984, Pat. Abs. of Japan, vol. 8, No. 247 (E 278) [1684] 11/13/84.

Takeda, Y. JP-A-6088482, May 18, 1985, Pat. Abs. of Japan, vol. 9, No. 234, (E-344) [1957] 9/20/85.

*Primary Examiner*—Nancy Swisher
*Attorney, Agent, or Firm*—Spencer & Frank

[57] ABSTRACT

Light transmitting glass having at least one surface area which is matted by surface pits, including an etched surface area having a population of merging or contiguous surface pits of polyhedral form, each pit having a small area so that at least 30% of visible light normally incident on the at least one surface is diffusely transmitted through the surface and the at least one surface having a total luminous transmittance of normally incident visible light of not less than TT−10 where TT is the total luminous transmittance through the same surface prior to etching expressed as a percentage of the total incident visible light.

13 Claims, 3 Drawing Sheets

100 μm

MATTED GLASS

BACKGROUND OF THE INVENTION

This invention relates to light transmitting glass having at least one surface area which is matted by surface pits. The invention also relates to a photo-voltaic cell comprising a glass sheet successively coated with a first conductive layer which is light transmitting, a photo-active layer and a second conductive layer. The invention further relates to a process of producing matted glass comprising forming a surface area of a piece of glass with a population of surface pits, and to a process of manufacturing a photo-voltaic cell comprising successively depositing on a glass sheet a first coating layer of a light transmitting conductive material, a second coating layer comprising photo-active material and a third coating layer being a second layer of conductive material.

The expression "matted glass" is well known in the art and denotes glass having at least one surface which has been de-polished. This result may be obtained mechanically, for example by sand-blasting, or by chemical attack, usually with the aid of hydrofluoric acid. In the present specification "matted" is used in relation to glass which has been subjected to chemical attack. Such matting is produced by etching the glass.

There is a demand for matted glass for various purposes. One such purpose lies in the provision of glazing panels for interior or exterior walls of building which allow illumination through the glazing while obscuring vision, so as to afford a degree of privacy.

SUMMARY OF THE INVENTION

It is an object of a first aspect of this invention to provide a new matted glass which meets this demand, and which offers certain advantages over known matted glasses produced by etching when used for that purpose.

Accordingly, a first aspect of this invention provides light transmitting glass having at least one surface area which is matted by surface pits, characterised in that such surface area has been etched to form a population of merging or contiguous surface pits of polyhedral form which are of such small area that at least 30% of visible light normally incident thereon is diffusely transmitted and such that the total luminous transmittance of normally incident visible light through that surface is not less than TT-10 where TT is the total luminous transmittance through the same surface prior to etching expressed as a percentage of the total incident visible light.

In this specification, "luminous transmittance" denotes the ratio of transmitted to incident light in accordance with ASTM Method D 307 (1964 Book of ASTM Standards, Part 21). "Diffuse" used in relation to light transmission denotes that proportion of light which in passing through glass is caused to deviate from the incident beam by scattering through more than 2.5°. "Diffuse" used in relation to light reflection denotes that proportion of light which on reflection at a glass/air interface is caused to deviate from the specularly reflected beam by scattering through more than 2.5°.

Such glass allows light transmission, but at the same time it substantially prevents optical resolution of any object through it, thus affording a degree of privacy. We have found that the said population of surface pits has little effect on total visible luminous transmittance through the glass. This is in contrast with previously known matted glass whose total luminous tranmittance diminishes appreciably because the glass is rendered absorbent. Furthermore, because such a high proportion of the light transmitted is diffuse, illumination through the glass will be more even than it is with known etched glasses.

In the most preferred embodiments of the invention, the total luminous transmittance of normal incident visible light through such matted surface area is not less than TT-3. By adopting this preferred feature of the invention, the matting treatment has very little effect (if any) in reducing the total luminous transmittance of the glass, so that for a high degree of illumination through the glass, it is only necessary to use glass having a fairly low specific internal absorption, for example ordinary soda-lime window glass.

In preferred embodiments of the invention, at least one said etched surface area is occupied by a said population of surface pits which are of such small size that a disk having a diameter of 10 μm cannot be placed thereon without overlapping at least two pits. In the most preferred embodiments of the invention, at least one said etched surface area is occupied by a said population of surface pits which are of such small size that a disk having a diameter of 5 μm cannot be placed thereon without overlapping at least two pits. The provision of a dense population of surface pits of such small size ranges is one of the factors which has an important effect in achieving a high diffuse transmittance. In practice, these tests would be performed on photo-micrographs, for example to a magnification of 1000 times.

With pits of such size, we have found the etched glass cannot be treated merely as a diffracting object in order to predict the extent of diffusion of light according to the classical laws of geometrical optics. For very small pits, it is not impossible that diffusion is governed by Rayleigh's equation according to which, for objects which are small in relation to the wavelength of the illuminating light, the intensity of the diffused light is proportional to the reciprocal of the fourth power of the wavelength ($\lambda$) of the light. It is however more likely that the intensity of the scattered light is proportional to $\lambda^{-n}$ (Mie's equation) where n lies in the range 0 to 4, and in fact for a pit diameter of about 5 μm, it appears that $n \simeq 1.5$.

The depth of the pits is also of importance. Advantageously, at least one said etched surface area is occupied by a said population of surface pits, substantially all of which pits have a depth in the range 0.1 μm to 1.0 μm inclusive. This is found to promote a wide angle of scatter of diffusely transmitted light. A wide angle of scatter is of benefit in promoting even illumination of a space behind a sheet of glass since the transmitted light is less strongly directional.

In the most preferred embodiments of the invention, at least one said etched surface area is occupied by a said population of surface pits, substantially all of which pits have a depth and mean transverse dimension (hereinafter call "diameter") which are so related that the depth of a said pit divided by its diameter is at least 0.01, and optimally lies between 0.02 and 0.5 inclusive. This is beneficial for promoting a large quantity of light which is diffused at the said etched surface area.

In particularly preferred embodiments of the present invention, the angle of scatter of diffuse light transmitted by such etched surface area is at least 10°. A large scattering angle is beneficial if the etched glass is to be used in certain types of photo-voltaic cell.

For some purposes, including use in a photo-voltaic cell, it is desirable that a large proportion of transmitted light should be transmitted diffusely. Accordingly, in some preferred embodiments of the invention, at least 40% and preferably at least 50% of light normally incident on said etched surface area is diffusely transmitted. This also promotes more even illumination of a space behind the etched glass, and it is of especial benefit when the glass is incorporated in a photo-voltaic cell.

Advantageously, the total solar energy transmissivity of the glass is at least 85% and preferably at least 90%. A high solar energy transmissivity, which entails a high visible light transmissivity, is desirable for good illumination and for other purposes.

Matted glass according to the invention may be of any desired physical shape, but it is preferred that the glass is in the form of a sheet, since it is believed that etched glass in sheet form will find the widest commercial application. The glass sheet may be etched on both sides, but in some preferred embodiments, the sheet has been etched on one main face only.

We have referred to the use of etched glass as hereinbefore defined in the context of photo-voltaic cells.

In the field of photo-voltaic cells, especially those to be used for converting solar energy to electrical energy, there is a continuing search for every higher energy conversion efficiency.

One of the factors affecting the conversion efficiency of a given type of cell is the length of the light path through the photo-active layer. A first consideration is that for the greatest incident light intensity, the cell should be oriented normally with respect to radiation from the light source. The length of the light path may thus be considered prima facie as equal to the optical thickness of the photo-active layer. Making that layer thicker will clearly lengthen that light path, so that there is a greater probability that any given photon will act to create an electron-hole pair within the photo-active material. However such an increase in the physical thickness of that layer will also increase the probability that an electron released therein will become trapped during its migration towards a conductive layer because the mean length of the electron migration paths will also be increased. This will at least in part negate the benefit of increasing the optical path length.

According to the present invention in its second aspect, there is provided a photo-voltaic cell comprising a glass sheet successively coated with a first conductive layer which is light transmitting, a photo-active layer and a second conductive layer, characterised in that said glass sheet is in accordance with the first aspect of the invention as herein defined.

The adoption of this aspect of the present invention provides a means of increasing the length of the path of light through a photo-active layer of a photo-voltaic cell without making a corresponding increase in the thickness of that layer. A diffused ray of light will travel through that layer as a cone rather than directly, with the result that there is an increase in the length of the mean path of the light and a greater probability that electron-hole pairs will be created. This can be done without increasing the physical thickness of the photo-active layer so that the mean length of the paths of migration of the electrons to a conductive layer remains the same, as does the possibility of just-released electrons becoming trapped during such migration. The result is an increased energy conversion efficiency.

The increase in efficiency afforded will be principally dependent upon three factors: the proportion of incident light which is transmitted diffusely; the scattering angle of such diffuse transmission; and the total transmissivity of the glass sheet. For increased efficiency, it is desirable that each of these three factors should be high.

In some embodiments, the glass sheet has a surface area with a population of merging or contiguous surface pits which are of such small area and profile that clearly legible typed characters of 10 pitch size are still clearly legible when viewed through such etched surface area when that surface is held at a distance of 10 cm from the said characters. In this way, a photo-voltaic cell according to this invention makes use of a new etched glass which is the subject of the invention which is described and claimed in our copending patent application filed Apr. 6, 1987, Ser. No. 07/035,266.

In some preferred embodiments of the invention in its second aspect, the glass sheet has an etched surface area which has a population of merging or contiguous surface pits which have been further treated so that at least the bottom portions of the pits are of rounded profile. It has been found that the use of such a glass increases the energy conversion efficiency while it also allows good resolution of an image of a light source through the glass. Such a glass is useful in photo-voltaic panels in which it is desired to see the internal circuit.

In the most preferred embodiments of this invention, the second conductive layer is a light reflecting layer. The adoption of this feature is especially preferred because it effectively doubles the optical path length through a layer of photo-active material of given thickness. It is particularly convenient to make the second conductive layer as a layer of aluminium.

Advantageously, the light-transmitting conductive layer is a layer of doped tin oxide. Doped tin oxide layers can be made highly transparent and with good conductivity. They can also be very durable which is of importance in withstanding the conditions to which they may be subjected during deposition of subsequent coating layers. Furthermore, tin oxide has a refractive index which is such that the cone of diffusely transmitted light will be further spread out when crossing that layer.

Preferably, the photo-active layer comprises a layer of amorphous silicon. Amorphous silicon can form an effective photo-active material. For example the photo-active layer may comprise three sub-layers, a 10 nm thick p-type contact layer in contact with the light-transmitting conductive layer and formed from a boron-doped alloy of amorphous silicon and carbon, a 500 nm thick amorphous silicon layer, and a 20 nm to 50 nm thick n-type contact layer, for example of phosphorus doped amorphous silicon. Such layers can be deposited by a vacuum deposition technique, for example a glow discharge technique using appropriate silanes as starting materials.

The use of amorphous silicon as photo-active material is known per se. It is also known that such photo-active layers may be made particularly sensitive to blue light or to red light. It is particularly recommended that the photo-active material should comprise a blue sensitive first layer in contact with the light-transmitting layer which blue sensitive layer is over-coated with a red sensitive second layer.

Preferably, the glass sheet has been etched on one main face only, and the coating layers are located on the opposite main face of the sheet. It is found easier to form coatings with good adherence onto a glass surface which has not been etched.

The present invention extends to a process of producing matted glass, and it accordingly, in its third aspect, it provides a process of producing matted glass comprising forming a surface area of a piece of glass with a population of surface pits, characterised in that such surface area is etched with a solution of a salt of hydrofluoric acid leaving a substantially contiguous population of fluorine-containing crystals, and in that such crystals are removed to leave such surface area with a population of merging or contiguous polyhedral surface pits which are of such small area that at least 30% of visible light normally incident thereon is diffusely transmitted and such that the total luminous transmittance of normally incident visible light through that surface is not less than TT-10 where TT is the total luminous transmittance through the same surface prior to etching expressed as a percentage of the total incident visible light. Such a process is especially valuable and convenient for forming a piece of etched glass for use in accordance with this invention. It is found that treatment with a salt of hydrofluoric acid can easily be arranged to give a very dense population of small surface pits which are occupied by fluorine-containing crystals due to the reaction between the salt solution and the glass, and the resulting etched surface of the glass transmits a high proportion of light diffusely without a substantial loss in total transmittance as compared with the glass prior to etching.

In the most preferred embodiments of the invention, said solution of a salt of hydrofluoric acid is an aqueous solution of one or more of potassium bifluoride, sodium bifluoride and ammonium bifluoride. The use of such a bifluoride promotes a chemical attach on the glass which is such as to leave, after removal of the fluorosilicate crystals formed, a pitted surface of a form which is particularly conveniently shaped for the purposes in view. The use of an alkali metal bifluoride ensures that attack on the glass will be substantially independent of the alkali metal content of the glass. Preferably, the solution of a salt of hydrofluoric acid substantially consists of potassium bifluoride in water. The use of potassium bifluoride is most effective.

Advantageously, the solution of a salt of hydrofluoric acid is an aqueous solution containing the salt in a proportion of from 70 to 200 grams per liter, and the surface area is exposed to such solution for a time of from 20 seconds to 2 minutes. This promotes the formation of a multiplicity of small fluorine-containing crystals which can be removed to leave a very dense population of small surface pits in the glass.

In some preferred embodiments of the invention, such etching step is preceded by an initial acid-washing step in which the surface area to be etched is washed with an acid solution. This is found to give a virgin surface which consequently allows a more uniform etching and results in a more uniformly treated product.

It is particularly convenient to effect the initial acid-washing by exposing said surface area to a solution comprising hydrofluoric acid and, optionally, sulphuric acid.

In some preferred embodiments of the invention, such etching step is preceded by a step in which the surface area to be etched is coated with a viscous film of organic material. This is found to have the effect of reducing the size of the pits which will be formed in the surface of the glass during the etching step, resulting in enhanced scattering through the etched surface area. Among suitable organic materials may be cited one or more of: sucrose, glucose, glycerine, glycol and polyvinyl pyrrolidone.

In fact we have found that the initial acid-washing step referred to above tends to result in the formation of larger crystals and thus larger pits during the etching step. We have found that it is possible to combine various successive treatment steps in such a way as to give some measure of control over the size of the crystals which will be formed during the etching step, and it is most preferred that the initial acid-washing step precedes such organic coating step.

The invention also includes a process of manufacturing a photo-voltaic cell, and accordingly, in its fourth aspect, the invention provides a process of manufacturing a photo-voltaic cell comprising successively depositing on a glass sheet a first coating layer of a light transmitting conductive material, a second coating layer comprising photo-active material and a third coating layer being a second layer of conductive material, characterised in that the glass sheet is treated in accordance with the third aspect of the invention. The use of such a process is especially convenient for the production of photo-voltaic cells in accordance with the second aspect of this invention.

Advantageously, the surface area of the sheet occupied by a population of merging or contiguous polyhedral surface pits is treated to remove a superficial stratum therefrom whereby the profile of at least the bottom portions of said pits is rounded. It has been found that the use of glass which has been subjected to such a treatment can increase the energy conversion efficiency in a photo-voltaic panel while it also allows good resolution of an image of a light source through the glass. Such a glass is useful in photo-voltaic panels in which it is desired to see the internal circuit.

The removal of the superficial stratum from the glass after the formation of pits therein to leave the pits with such a rounded profile may be effected by a mechanical polishing treatment, but it is more convenient, and generally easier to achieve a more uniform treatment if, as is preferred, the superficial stratum removal is effected in a chemical polishing step.

Advantageously, the chemical polishing is effected by exposing said surface area to a solution comprising hydrofluoric acid. Such a treatment is quite simple to perform to impart the required profile to the surface pits to leave an etched surface area on the glass promoting a high light transmissivity.

It is especially convenient to effect the chemical polishing by exposing the surface area for a time of from 60 minutes to 20 seconds to a solution comprising from 1.0% to 20% hydrofluoric acid and 0% to 15% sulphuric acid.

Advantageously, the sheet of glass is etched on one main face only, and the coating layers are deposited on the face opposite the etched face. This facilitates the deposition of strongly adherent coating layers.

It is desired to enhance the resistance of the etched glass of breakage, the glass may be chemically tempered after the final etching treatment without impairing its optical properties.

A dealkalising treatment may be performed on the glass after etching to reduce the alkali metal ion population in surface layers thereof, if this is desired.

BRIEF DESCRIPTION OF THE DRAWINGS

Preferred embodiments of the present invention will now be described by way of example and with reference to the accompanying drawings.

DESCRIPTION OF THE PREFERRED EMBODIMENTS

EXAMPLE 1

Figure 1:
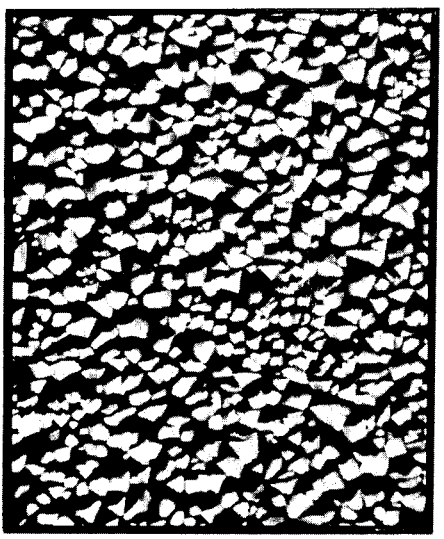
FIGS. 1 and 2 are each an electron-micrograph of a sheet of glass which has been subjected to a treatment in accordance with this invention.

A sheet of drawn soda-lime glass 1.9 mm thick was dipped in an aqueous solution containing between 70 and 150 g/L potassium bifluoride in an etching bath at ambient temperature (approximately 20° C.) for a period of about 1 minute. A layer of crystals of potassium fluorosilicate was formed on the immersed surfaces of the glass, and these were removed by washing in water. The resulting surface was found to be densely populated by a multiplicity of polyhedral surface pits each having a maximum dimension of between about 5 $\mu$m and about 1 $\mu$m, and a depth of the order of 0.4 $\mu$m. An electron-micrograph of that surface to a scale as marked of approximately 1000 times magnification is shown as FIG. 1. It is not possible to place a 10 mm disc (10 $\mu$m×1000) on FIG. 1 without overlapping at least two pits. The glass whose surface was so treated exhibited excellent light diffusing properties. The total luminous transmittance of the thus treated sheet was about 88%, and the diffuse transmittance was about 60% of normally incident light. Prior to treatment, the total transmittance of the glass sheet was about 93%.

EXAMPLE 2

Figure 2:
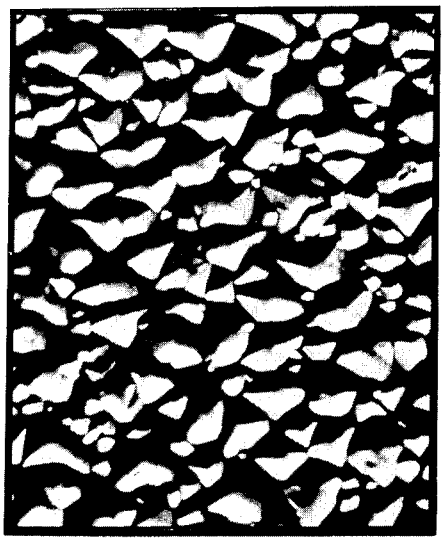
Figure 3:
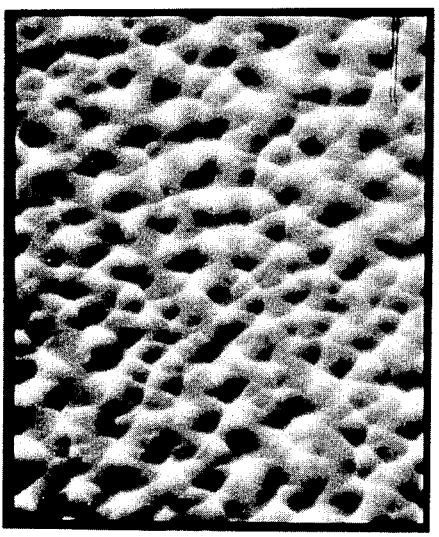
FIGS. 3 and 4 are each an electron-micrograph of a sheet of glass which has been treated prior to incorporation into a photo-voltaic cell in accordance with this invention.

In order to vary the size of the pits formed, and to achieve a more uniform pit size, the etching step of the preceding Example was preceded by an acid-washing step in which the glass was washed with an initial acid-washing solution containing by volume 1% hydrofluoric acid and 6% sulphuric acid in water for several minutes at ambient temperature. After rinsing in water, the glass was subjected to the same etching treatment and then washed in water. An electron-micrograph of the resulting surface to a scale as marked of approximately 1000 times magnification is shown as FIG. 2. The resulting surface pits had a maximum dimension ranging between 7 $\mu$m and 10 $\mu$m having a depth of up to 0.8 $\mu$m, with a scattering of much smaller pits. It is not possible to place a 10 mm disc (10 $\mu$m×1000) on FIG. 2 without overlapping at least two pits. The total luminous transmittance of the thus treated sheet was increased to about 93% and the proportion of normally incident light which was transmitted diffusely was increased to slightly more than 75%.

EXAMPLE 3

Figure 4:
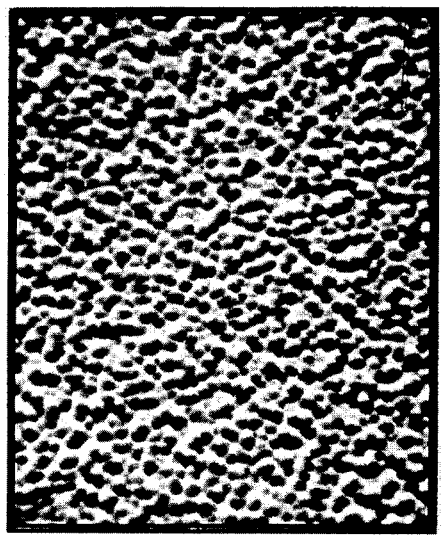

A sheet of drawn soda-lime glass 1.5 mm thick was subjected to the same initial acid-washing treatment as in Example 2. After this initial acid-washing treatment, the glass was rinsed and dipped in a bath containing glycerine and water to leave a film of glycerine on the surface of the glass. The glycerine-coated glass was then dipped in an etching bath containing an aqueous solution of potassium bifluoride (70 to 120 g/L) at ambient temperature (approximately 20° C.) for a period of 30 to 60 seconds. The glass was removed and rinsed in water and was then immersed in a chemical polishing bath containing 10% hydrofluoric acid and 4% sulphuric acid (aqueous) for 2 minutes at ambient temperature, and then again rinsed. An electron-micrograph of the resulting surface to a scale as marked of approximately 1000 times magnification is shown as FIG. 4. This shows a dense population of surface pits which have a rounded profile with a maximum dimension of less than 5 $\mu$m and a depth of the order of 0.4 $\mu$m. It is not possible to place a 5 mm disc on FIG. 4 without overlapping at least two of the pits.

Figure 5:
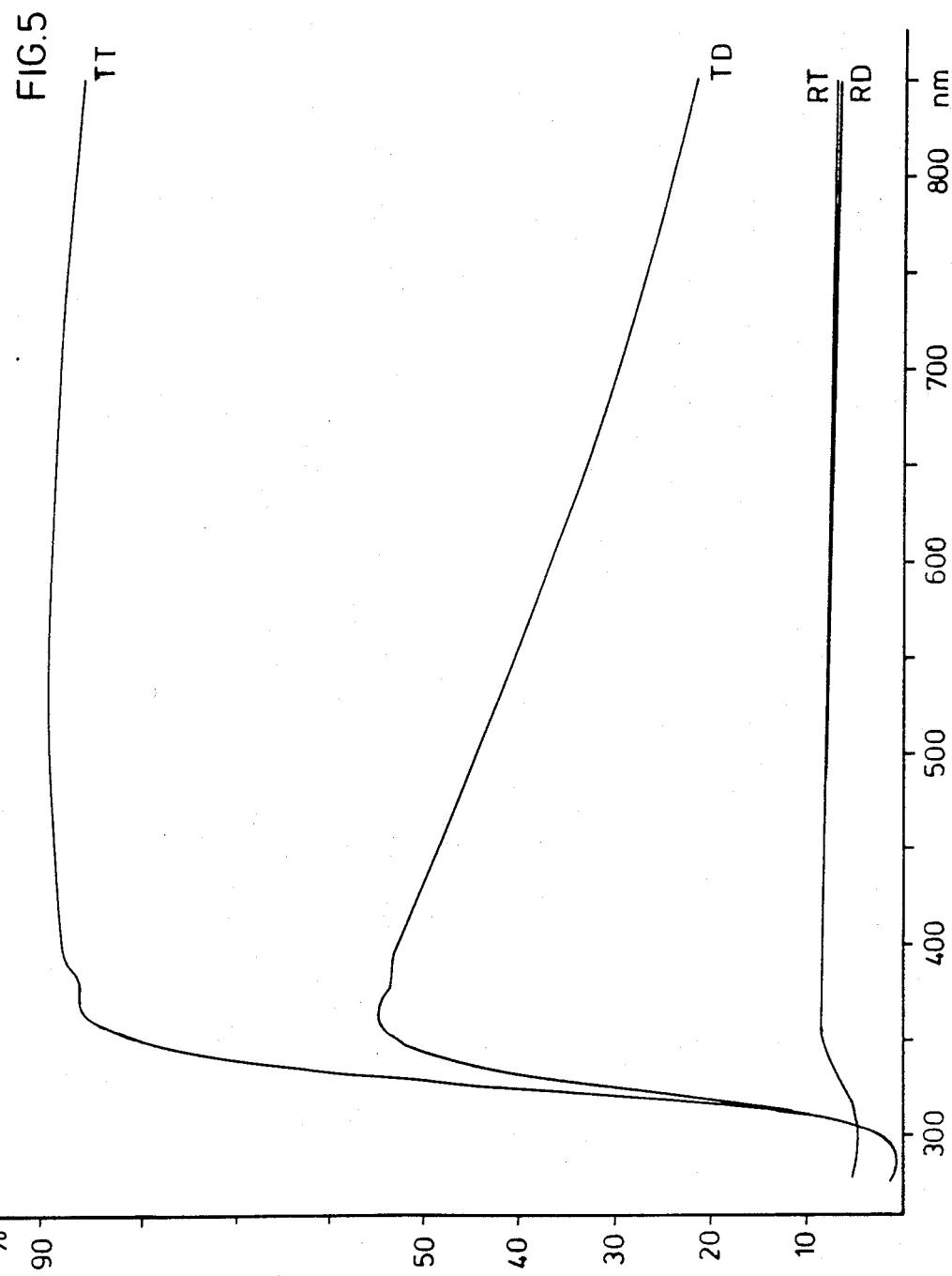
FIG. 5 is a graph showing luminous transmittance and reflectance curves for the treated glass shown in FIG. 4.

The graph of FIG. 5 shows, as a percentage of normally incident light:
at TT, the total luminous transmittance for various wavelengths
at TD, the diffuse transmittance for those wavelengths
at RT, the total light reflectance for those wavelengths, and
at RD, the diffuse reflectance for those wavelengths.

It will be noted that the proportion of transmitted light which is diffuse decreases with increasing wavelength over the visible range.

The sheet of drawn soda-lime glass treated as specified in this Example had the following optical properties integrated over the visible spectrum:

| | |
|---|---|
| Total transmittance | 89.48% of normally incident light |
| Diffuse transmittance | 45.61% of normally incident light |
| | 50.97% of transmitted light |
| Total reflectance | 7.96% of normally incident light |
| Diffuse reflectance | 7.58% of normally incident light |
| | 95.23% of reflected light |

Before treatment, the glass sheet had a total transmittance of 90.50% for normally incident light.

The angle of scatter of the light which was transmitted diffusely at the etched surface of the glass was greater than 10°.

EXAMPLE 4

A sheet of drawn soda-lime glass 1.04 mm thick was subjected to initial acid-washing, glycerine-coating and rinsing treatments as described in Example 4, and was then etched for less than one minute at ambient temperature in a bath containing an aqueous solution of potassium bifluoride (150 to 200 g/L). The glass was removed and rinsed in water and was then immersed in a chemical polishing bath containing by volume 10% hydrofluoric acid and 5% sulphuric acid (aqueous) for 3 minutes at ambient temperature, and then again rinsed. The surface structure of the sheet was very similar to that shown in FIG. 4. The thus treated sheet had a very high total luminous transmittance calculated as 93.40%, and a diffuse transmittance of 40.97% of normally incident visible light. The total transmittance of the glass prior to treatment was 93.60%. The angle of scatter of the light which was transmitted diffusely at the etched surface of the glass was greater than 10°.

In a variant of any of the foregoing Examples, the etching step is performed using sodium bifluoride or ammonium bifluoride instead of potassium bifluoride. This gives very similar results.

In another variant, the treated glass is subsequently chemically tempered to increase its resistance to mechanical shock. This makes no appreciable difference to the optical properties of the glass.

An etched glass sheet in accordance with any of the foregoing Examples is of particular benefit for use in photo-voltaic cells, especially those of the amorphous silicon type.

Figure 6:
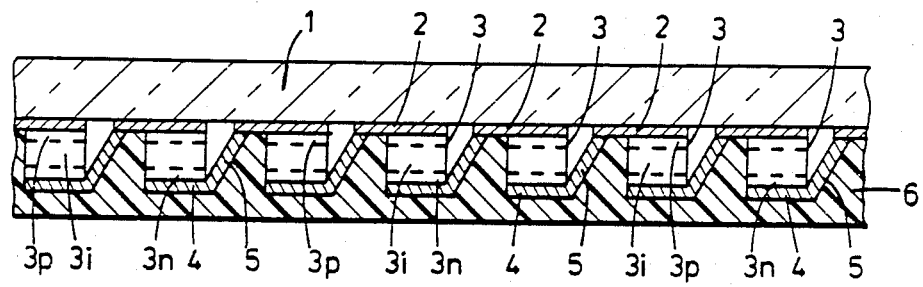
FIG. 6 is a diagrammatic sectional view of a photo-voltaic cell in accordance with this invention.

A panel bearing several such cells which are series interconnected is shown in FIG. 6. In FIG. 6, a sheet of glass 1 which has been etched on one or both sides is provided on one side with a plurality of photo-voltaic cells. Each cell is formed by successive layers of doped tin oxide 2 for example 70 nm in thickness, amorphous silicon 3 and a reflective conductor 4 such as aluminum which may be 100 nm to 500 nm in thickness. The reflective conductor 4 of each cell is connected by a conductor 5 to the tin oxide layer 1 of the next cell so that the cells are series interconnected. A protective film 6 is deposited over the cells. The amorphous silicon layer 3 of each cell is constituted by three sub-layers, a 10 nm thick p-type contact layer 3p in contact with the light-transmitting conductive layer and formed from a boron-doped alloy of amorphous silicon and carbon, a 500 nm thick amorphous silicon intermediate layer 3i, and a 20 nm to 50 nm thick n-type contact layer 3n formed of phosphorus doped amorphous silicon. Such layers can be deposited by a vacuum deposition technique, for example a glow discharge technique using appropriate silanes as starting materials.

In a variant, these three sub-layers 3p, 3i, 3n are overcoated with a second set of three sub-layers, not shown, to form a second photo-active layer. By making the first such layer 3 sensitive to blue light, and the second sensitive to red light, considerable increases can be achieved in the overall efficiency of the device.

In the manufacture of such photo-voltaic devices, it is desirable to use glass which has been etched on one side only, and to form the photo-voltaic panel by depositing the active coating layers on the face opposite to that which has been etched. This leads to even greater efficiency. We have deposited substantially identical active coating layers to form photo-voltaic cells on three sheets of glass of the same thickness. Of these sheets, one (cell A) was untreated, and two were etched by a process according to Examples 3, 4 or 5 on one face only. The active layers were deposited on the etched face to form cell B and on the non-etched face to form cell C. It was found that cell B yielded a 15% increase in current as compared with cell A, and in fact its yield was substantially the same as that of a crystalline silicon cell of the same area. Cell C was even more efficient, and yielded 30% more current than cell A.

We claim:

1. Light transmitting glass having at least one surface area which is matted by surface pits, comprising;
an etched surface area having a population of merging or contiguous surface pits of polyhedral form, which population of merging or contiguous surface pits have a small area so that a disk having a diameter of 10 μm cannot be placed thereon without overlapping at least two pits and so that at least 30% of visible light normally incident on said surface is diffusely transmitted through said surface and said surface having a total luminous transmittance of normally incident visible light of not less than TT-10, where TT is the total luminous transmittance through the same surface prior to etching expressed as a percentage of the total incident visible light.

2. Glass according to claim 1, wherein the total luminous transmittance of normally incident visible light through said surface area is not less than TT-3.

3. Glass according to claim 1, wherein at least one said etched surface area is occupied by a said population of surface pits which are of such small size that a disk having a diameter of 5 μm cannot be placed thereon without overlapping at least two pits.

4. Glass according to claim 1, wherein at least one said etched surface area is occupied by a said population of surface pits, substantially all of which pits have a depth in the range 0.1 μm to 1.0 μm inclusive.

5. Glass according to claim 4, wherein at least one said etched surface area is occupied by a dense population of surface pits, substantially all of which pits have a depth and diameter which are so related that the depth of a said pit divided by its diameter lies between 0.02 and 0.5 inclusive.

6. Glass according to claim 1, wherein at least one said etched surface area is occupied by a said population of surface pits, substantially all of which pits have a depth and mean transverse dimension (hereinafter called "diameter") which are so related that the depth of a said pit divided by its diameter is at least 0.01.

7. Glass according to claim 1, wherein the angle of scatter of diffuse light transmitted by such etched surface area is at least 10°.

8. Glass according to claim 1, wherein at least 40% of light normally incident on said etched surface area is diffusely transmitted.

9. Glass according to claim 8, wherein at least 50% of light normally incident on said etched surface area is diffusely transmitted.

10. Glass according to claim 1, wherein the total solar energy transmissivity of the glass is at least 85%.

11. Glass according to claim 10, wherein the total solar energy transmissivity of the glass is at least 90%.

12. Glass according to claim 1, wherein the piece of glass is in the form of a sheet.

13. Glass according to claim 12, wherein the glass sheet has been etched on one main face only.

* * * * *